United States Patent [19]

Greenwood

[11] Patent Number: 4,521,969
[45] Date of Patent: Jun. 11, 1985

[54] APPARATUS FOR ELECTRICAL CONNECTION OF MULTICONDUCTOR CABLES

[75] Inventor: William S. Greenwood, Nutley, N.J.

[73] Assignee: Thomas & Betts Corporation, Raritan, N.J.

[21] Appl. No.: 42,442

[22] Filed: May 25, 1979

[51] Int. Cl.³ .......................... H02G 5/04; H05K 1/00; G01B 3/30
[52] U.S. Cl. ................................. 33/180 R; 33/562; 33/1.92; 339/17 F
[58] Field of Search ................. 339/18 C, 18 P, 97 C, 339/17 F, 113 R; 29/720, 721, 745, 747, 760; 174/68.5; 33/174 G, 180 R, 189, 185

[56] References Cited

U.S. PATENT DOCUMENTS

| 1,545,424 | 7/1925 | Heimrich | 33/189 |
|---|---|---|---|
| 2,019,625 | 11/1935 | O'Brien | 339/17 |
| 2,575,343 | 11/1951 | Heiman | 33/174 D |
| 2,613,287 | 10/1952 | Geiger | 339/17 E |
| 3,028,573 | 4/1962 | Stoehr | 339/17 |
| 3,499,098 | 3/1970 | McGahey et al. | 339/18 C |
| 3,551,585 | 12/1970 | Smart | 174/68.5 X |
| 3,713,072 | 1/1973 | Henschen et al. | 339/17 F |
| 3,960,430 | 6/1976 | Bunnell et al. | 339/97 C |
| 3,984,621 | 10/1976 | Propst | 174/48 |
| 4,002,393 | 1/1977 | Merry et al. | 339/97 C |
| 4,030,801 | 6/1977 | Bunnell | 339/121 |
| 4,054,353 | 10/1977 | Saunders et al. | 339/176 MF |

FOREIGN PATENT DOCUMENTS

| 859775 | 12/1952 | Fed. Rep. of Germany | 174/72 |
|---|---|---|---|
| 2254395 | 11/1972 | Fed. Rep. of Germany | . |
| 2245982 | 4/1973 | Fed. Rep. of Germany | 339/97 C |

OTHER PUBLICATIONS

American Machinist, 2/23/28, Self Locating Drill Jig, pp. 349–350.
"Under Carpet Power & Comm. Wire System", Fleischhacker, Nov. 18–20, 1975.
"Flat Cable: Under–Carpet Breakthrough", Building Design & Construction, 4/79, pp. 26–29.
"The Great Cover-Up".
MSFC-SPEC-494A, 4/30/73.
NASA TM X-64916, 3/75.
NASA TM X-64887, 8/74.
NASA SP-5120, 12/74, pp. 28–29.
"Flat Conductor Cable Bldg. Wiring Systems", NASA.
"Tentative Interim Amdt. to the 1978 National Electrical Code", National Fire Protection Ass., 1/78.
"A Better Way to Wire," Telephony, 1/8/79.
"TUCC System".
*Electronic Design:* "Cable Connections the Easy Way", 10/15/58.

Primary Examiner—Harry N. Haroian
Attorney, Agent, or Firm—Robert M. Rodrick; Salvatore J. Abbruzzese

[57] ABSTRACT

In connecting flat multiconductor cables, one cable is placed atop another to provide a matrix of zones in which connections may be made of any conductor of one cable to any conductor of the other cable. Selection is made of one zone and it is perforated. An insulation-piercing connector is inserted through the perforation and crimped to provide an electrical connection between the pair of cable conductors in registry with the selected zone. Selection of further zones for perforation and connector insertion is made progressively from those zones which do not have in registry therewith any conductor which was in registry with any previously selected zone. Apparatus for implementing preferred connection zone selection precludes use of connecting zones other than a singular zone for connection of one conductor pair and compels use of a selective few zones individually for connection of respective other conductor pairs, thereby lessening connection error likelihood.

6 Claims, 11 Drawing Figures

APPARATUS FOR ELECTRICAL CONNECTION OF MULTICONDUCTOR CABLES

FIELD OF THE INVENTION

The invention relates generally to methods and apparatus for the making of electrical connections and pertains, more particularly, to electrical interconnection of flat multiconductor cable in undercarpet use.

BACKGROUND OF THE INVENTION

In presently known undercarpet wiring systems, flat multiconductor cables to be connected are arranged either in respective longitudinal abutting relation for splices or in respective orthogonal abutting relation for taps. In the case of the splice, individual conductors are mutually aligned, whereby confusion as to conductors to be interconnected does not arise. An insulation displacing/piercing connector is simply positioned beneath the cable in alignment with each pair of conductors to be connected and is crimped therethrough. One conductor of one cable thus cannot readily be erroneously connected to plural conductors of the other cable.

In the case of tap connections, on the other hand, the possibility of installer confusion and error is quite real. Here, by reason of mutual orthogonality, each conductor of one cable runs in the direction of and may be connected to, all conductors of the other cable. Connection of one conductor of one cable to plural conductors of the other cable can readily arise.

Such confusion is inherently eliminated by use of a unique length connector for each connection to be made. However, this practice requires as many as five unique length connectors to be available, i.e., for a three-phase tap with neutral and ground carried through, and requires proper installer selection of unique length connectors. Apart from these matters, this type of connecting practice has disadvantage in that all connectors, except for the shortest length one, span plural conductors of one of the cables, thereby providing the potential for interphase short circuit.

In the undercarpet wiring system adopted by the assignee of the subject application, described and set forth in copending applications Ser. Nos. 42,369 now U.S. Pat. No. 4,249,304 and 42,544 now U.S. Pat. No. 4,283,593, respectively entitled "Multiconductor Cable Arrangement and Electrical Connection" and "Multiconductor Cable", cable to be interconnected are placed in mutually overlapping relation, as contrasted with the above-noted mutually abutting relation. In such overlapping arrangement, a matrix of possible connection zones is presented. For example, in a three-conductor to three-conductor tap, nine zones are in the overlap area, each zone presenting a unique pair of conductors for possible connection. Those conductor pairs to be connected are perforated and an insulation displacing/piercing connector is inserted through the perforation and is crimped onto those cable surfaces exterior to the overlap. A common-sized connector is used throughout and has no expanse, when crimped, which extends outwardly of the connection zone involved. There is thus no need for diverse-sized connectors at installation and no need for care in connector selection by an installer. Since the connectors do not span plural conductors of one cable, short-circuiting possibility, arising from an individual connector, is diminished. These advantages are seemingly set off, however, by a loss of the advantage inherent in the use of different-sized connectors and noted above, i.e., a lessening of the possibility of the connection of one conductor of one cable to plural conductors of the other cable.

SUMMARY OF THE INVENTION

This invention has as its object the provision of improved methods and apparatus for the electrical interconnection of multiconductor cables.

It is a more particular object of the invention to provide methods and apparatus for use in the electrical interconnection of mutually overlapped flat multiconductor cables.

In attaining the foregoing and other objects, the subject invention provides practice wherein multiconductor cables, arranged in mutal overlapping relation and presenting the foregoing connection zone matrix, are electrically connected by making only selective of said zones usable for actual connection of conductor pairs. In preferred practice, the invention precludes use of a connection zone other than a singular zone for connection of one pair of conductors, and compels connection of at least one other pair of conductors to preselected plural zones. Apparatus for such limiting of zone usage includes a selectively apertured connection guide, preferably having capability for providing alignment of overlapped cables and the guide aperture pattern.

The foregoing and other features of the invention will be further evident from the following detailed description of preferred embodiments and from the drawings wherein like reference numerals identify like parts throughout.

DESCRIPTION OF PREFERRED PRACTICES AND EMBODIMENTS

Figure 1:
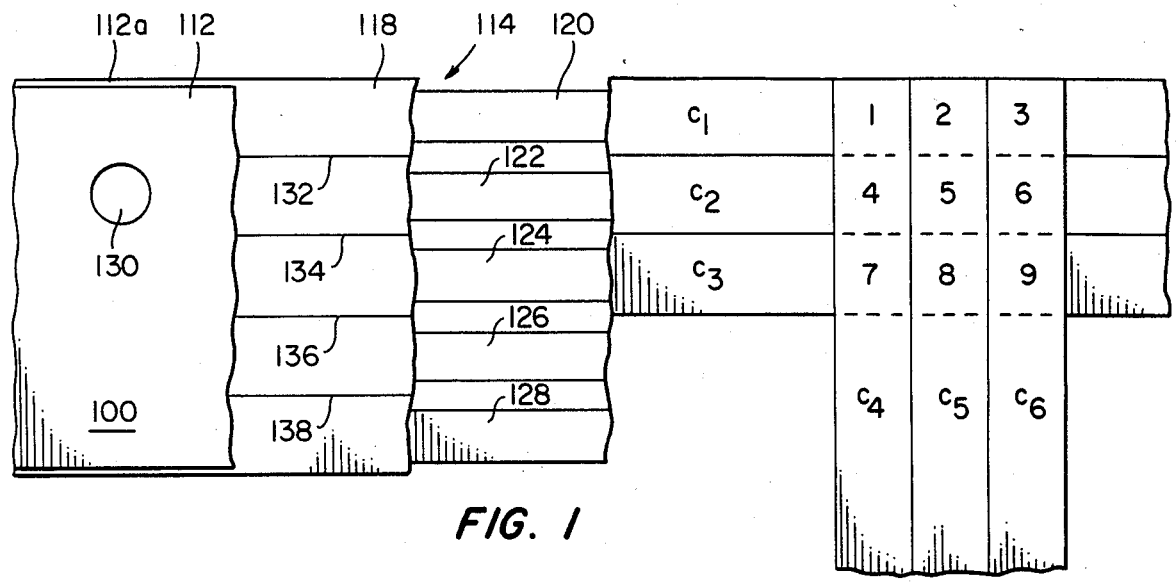
FIG. 1 is a plan view showing, in its leftward portion, a multiconductor cable with overlying shield, and in its rightward portion, a pair of three-conductor cables in overlapping relation.
Figure 2:
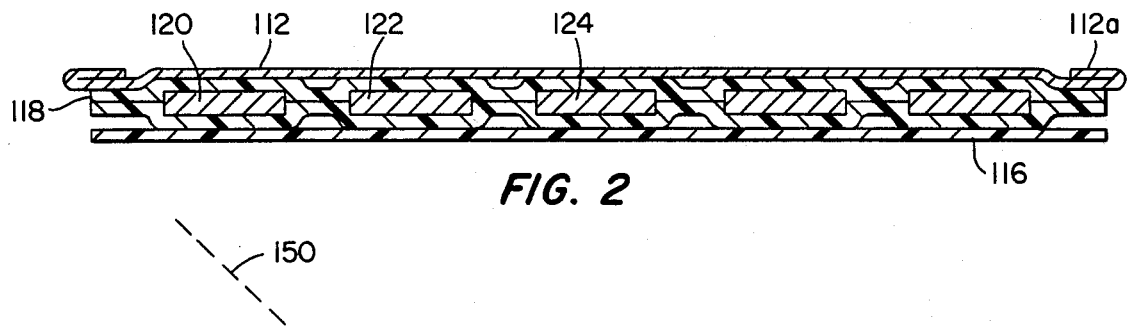
FIG. 2 is a section view taken to the left of weldment 130 of FIG. 1.

Referring to FIGS. 1 and 2, cable assembly 100 includes an overlying shield 112, comprised of electrically conductive sheet material, a multiconductor cable 144 and underlying plastic sheet 116. Cable 114 has an electrically insulative casing 118 formed of opposed plastic sheets which envelop flat electrical conductors 120, 122, 124, 126 and 128. Shield 112 is joined to the grounding conductor 122 of cable 114 as by weldments 130, mutually spaced along the cable length, as more fully set forth in the above-identifed commonly-assigned U.S. patent applications. Prior to securement of shield 112 to cable 114, the cable may be reduced from the five-conductor cable, shown at the left in FIG. 1, to a four-conductor cable, or to a three-conductor cable, shown at the right in FIG. 1, by separating individual or plural conductors along lines 132, 134, or 136.

Considering the right-hand portion of FIG. 1, a tap connection arrangement is shown wherein conductors 120, 122 and 124 (further denoted as $c_1$, $c_2$ and $c_3$) underlie another three-conductor cable having conductors $c_4$, $c_5$ and $c_6$. The mutual overlap area defines a matrix of nine possible connection zones, identified as 1 through 9, each such zone being uniquely characterized by having a singular pair of conductors $c_1$–$c_6$ in registry therewith. Thus, zone 1 has only conductors $c_1$ and $c_4$ in registration, zone 2 has only conductors $c_1$ and $c_5$, etc.

In this example n objects are presented for combination in sets of x, where n is the number of conductors (six) and x is the number of electrical connections (three) to be made. Since permutations are not relevant (zones 1, 5, 9 provide the same result as 9, 5, 1 and 5, 1, 9, etc.), they are not considered. The number of possible combinations is $n!/x!(n-x)!$, or twenty combinations. Of these twenty possible combinations, only six are usable to provide connections of $c_1$–$c_3$ to $c_4$–$c_6$, as in the following table:

TABLE 1

| Combination | Connections | Zones |
|---|---|---|
| I | $c_1c_4$, $c_2c_5$, $c_3c_6$ | 1-5-9 |
| II | $c_1c_6$, $c_2c_5$, $c_3c_4$ | 3-5-7 |
| III | $c_1c_4$, $c_2c_6$, $c_3c_5$ | 1-6-8 |
| IV | $c_1c_5$, $c_2c_6$, $c_3c_4$ | 2-6-7 |
| V | $c_1c_6$, $c_3c_5$, $c_2c_4$ | 3-8-4 |
| VI | $c_1c_5$, $c_2c_4$, $c_3c_6$ | 2-4-9 |

The remaining fourteen possible combinations will lead to electrical connection error. By way of example, the combination of connections $c_1c_2$, $c_3c_4$, $c_5c_6$ is manifestly not usable and would yield interphase short-circuiting.

Figure 3:
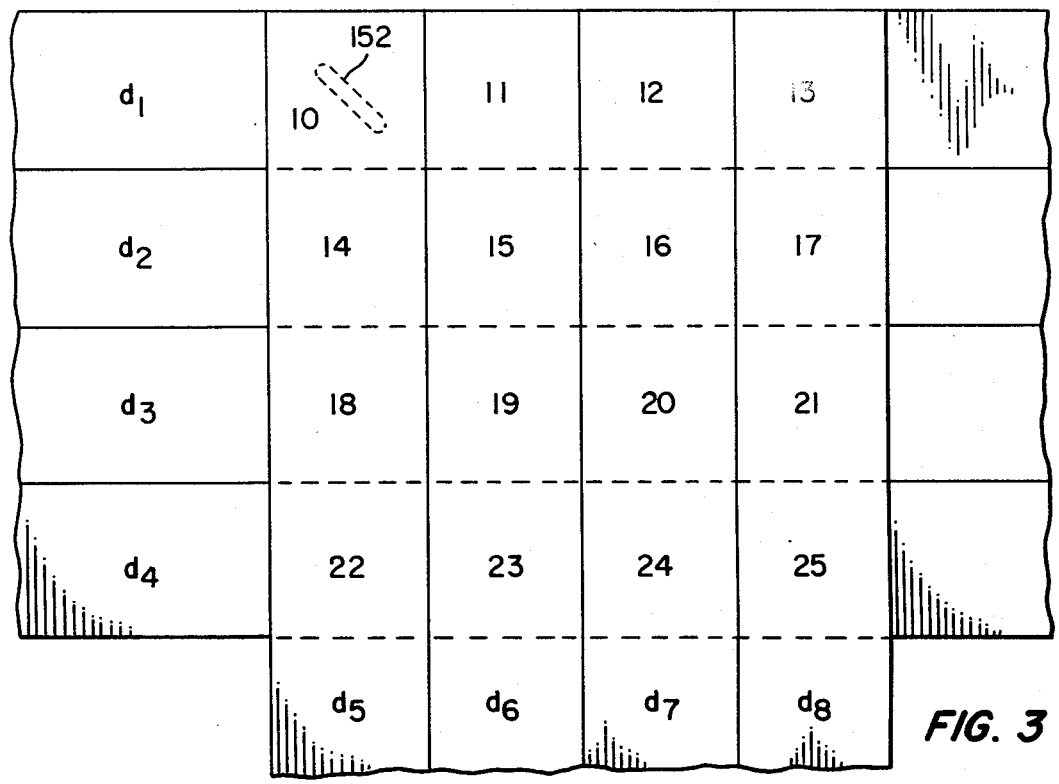
FIGS. 3 and 4 are plan views of pairs of four- and five-conductor cables in overlapping relation.
Figure 5:
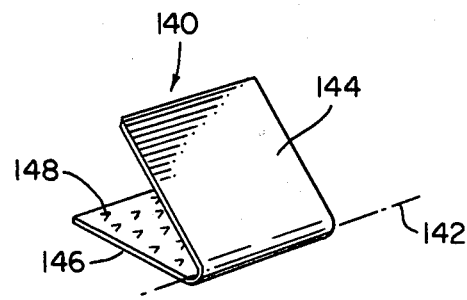
FIG. 5 is a perspective view of a type of connector suitable for use in practicing the invention.

In FIG. 3, a four-conductor to four-conductor tap has conductors $d_1$ through $d_8$. The connection zone matrix has sixteen registration zones, i.e., zones 10-25. With n now eight and x now four, the number of possible combinations for connection are $8!/4!(8-4)!$, or seventy. Of these, only twenty-four are usable to provide connection of $d_1$–$d_4$ to $d_5$–$d_9$.

Figure 4:
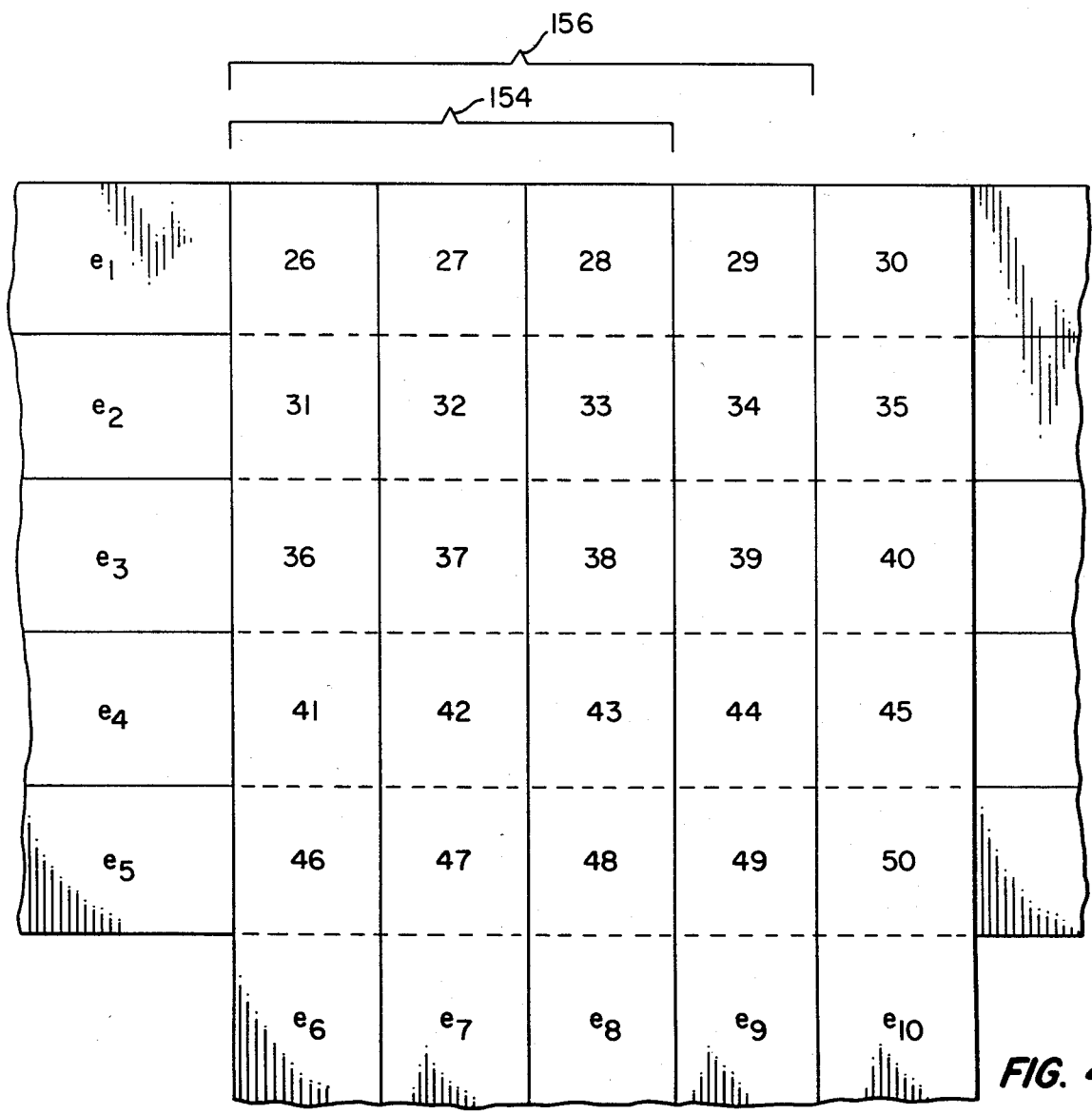

In FIG. 4, a five-conductor to five-conductor tap has conductors $e_1$ through $e_{10}$. The connection zone matrix has twenty-five registration zones, i.e., zones 26-50. With n now ten and x now five, the possible combinations number $10!/5!(10-5)!$, or two hundred fifty-two. Ninety thereof are usable to provide connection of $e_1$–$e_5$ to $e_6$–$e_{10}$.

As is made evident by the foregoing discussion of FIGS. 1–3, an installer of flat cables in overlapping manner is faced with a plethora of possible connections and a correspondingly high risk of installation error. The present invention looks to the provision of methods for selecting connection patterns from those available, lessening error risk and making cable installation less judgmental to the installer.

In one such method, selection is made at the outset of an origin location for a pattern. For example, in a four-four tap of $d_1$–$d_8$ (FIG. 3), zone 10 may be made the origin location and conductors $d_1$ and $d_5$ are therein provided with registering perforations. Selection is now made of a second connection location from those connection locations comprising all zones not having registered therewith either of the conductors registered with the origin location, i.e., in the example of FIG. 3, zones 15-17, 19-21, and 23-25. Zone 15 is selected for discussion purposes and conductors $d_2$ and $d_6$ are therein provided with registering perforations. The selection of a third connection location is now made from those connection locations comprising all zones not having registered therewith any of the conductors registered with the origin, and second locations, i.e., in the example of FIG. 3, zones 20, 21, 24 and 25. If zone 20 is selected, then zone 25 is the fourth connection location. If zone 21 is selected as the third connection location, then zone 24 is the fourth connection location. Assuming zones 20 and 25 to have been selected, perforations are made in zone 20 through conductors $d_3$ $d_7$ and in zone 25 through $d_4$ and $d_8$. Connectors are now inserted through the perforations in the selected connection locations and crimped onto the outer surfaces of the cables.

In FIG. 4, connector 140 is shown in open condition, partially bent about axis 142 to define portions 144 and 146, each having insulation piercing teeth 148. The connection location geometry in FIG. 3, selected in the example, is diagonal 150 and the perforations are elongate slots 152 along diagonal 150. Portion 144 and 146 is inserted into the slot until bend axis 142 is within the slot. The connector is then rotated about its bend axis to place teeth 148 in facing relation to the outer surfaces of the cables. All connectors may be so placed in position without crimping until a final check of the tap connection is made. The connectors are then crimped in place, teeth 148 thereupon being electrically connected to the underlying conductors and mechanically fixed in place.

The method set forth for three-three, four-four and five-five conductor taps is equally applicable to provide correctness in taps between cables having different numbers of conductors. Referring again to FIG. 4, a three-conductor cable 154 having conductors $e_6$, $e_7$ and $e_8$ is to be tapped to the cable having conductors $e_1$–$e_5$. Assignment is made of $e_1$ as the neutral conductor of a three-phase power line, $e_2$ as the ground conductor, and $e_3$–$e_5$ as phases A, B and C, respectively. In conforming order, i.e., polarizing cable 154 to the $e_1$ assignment, the connection origin is selected to be location 26 whereby $e_6$ will be the neutral conductor of cable 154. Of the connection location group available for remaining connections, i.e., zones 32, 33, 37, 38, 42, 43, 47 and 48, zone 32 is selected to connect conductor $e_7$ to ground conductor $e_2$.

Figure 6:
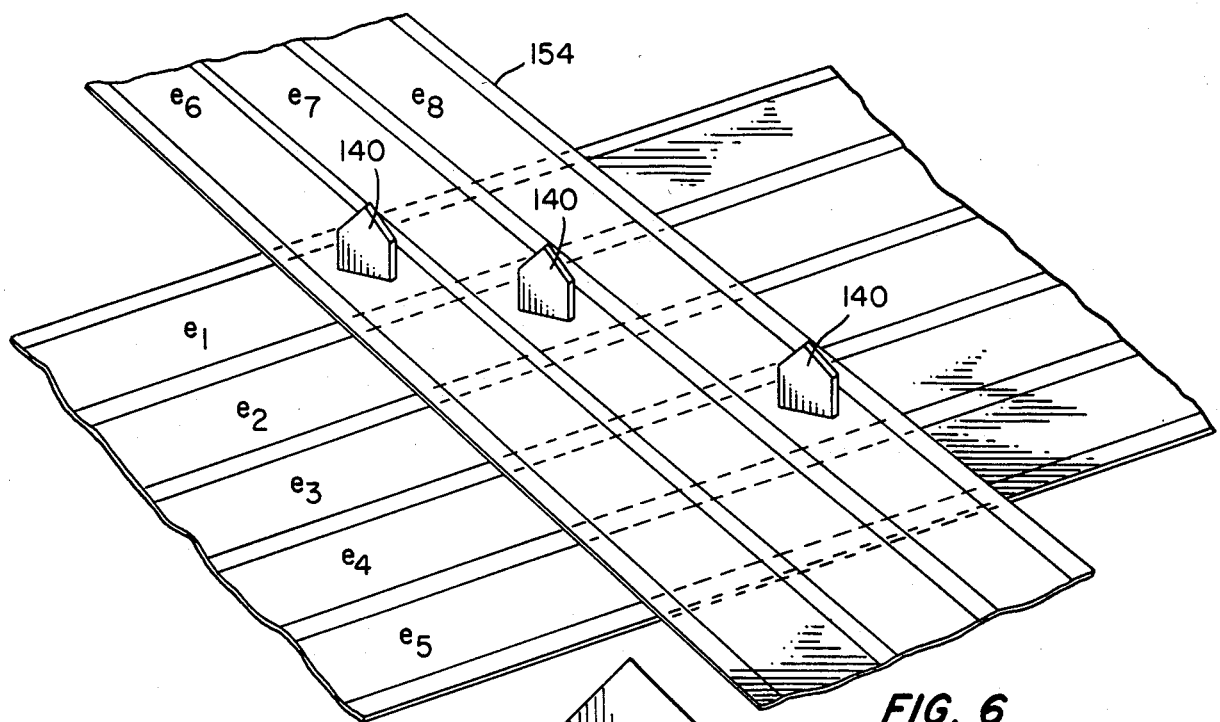
FIG. 6 is a perspective view of a five-to-three conductor tap with connectors of FIG. 5 type in tap-securing but uncrimped condition.

Choice is now open to the system installer or designer, for load balancing or phasing purposes, of remnant available connection zones 38, 43 and 48, i.e., those zones which do not have in registry therewith any of conductors $e_1$, $e_2$, $e_6$ $e_7$. Whichever zone is selected, no further connection zones remain available, since conductor $e_8$ is in registry with all of zones 38, 43 and 48, thereby excluding those unselected zones from further use. Where either zone 43 or 48 is selected, connection pattern geometry now departs from complete diagonal. FIG. 6 depicts the assembly reached by selection of zone 43, with uncrimped connectors in place.

Cable 156 of FIG. 4 includes four conductors $e_6-e_9$ and may be connected to the $e_1-e_5$ cable as follows. Where polarization is desired, connections are again made in zones 26 and 32 for $e_1$, $e_6$ and $e_2$, $e_7$, respectively, now leaving six zones 38, 39, 43, 44, 48 and 49 for the making of the two phase connections. Assuming zone 48 to be chosen for conductor $e_8$, i.e., phase C, there remain only zones 39 and 44 for conductor $e_9$ with corresponding choice of phase A or phase B. Again, no connection zones remain under the foregoing method, once this last-noted choice is made.

In preferred practice, installer assistance is enhanced over that generally afforded by the above methods, by imposing predetermined geometry for the making of connections. In this practice, polarization is applied to first and second adjacent connections of any set of connections and such adjacent connections are invariantly made. The foregoing general method is limited to these connections and selection of further connections is biased or compelled by use of a connection guide in the form of a template or stencil having apertures or slots in predetermined pattern, such as is shown in FIG. 7.

Figure 7:
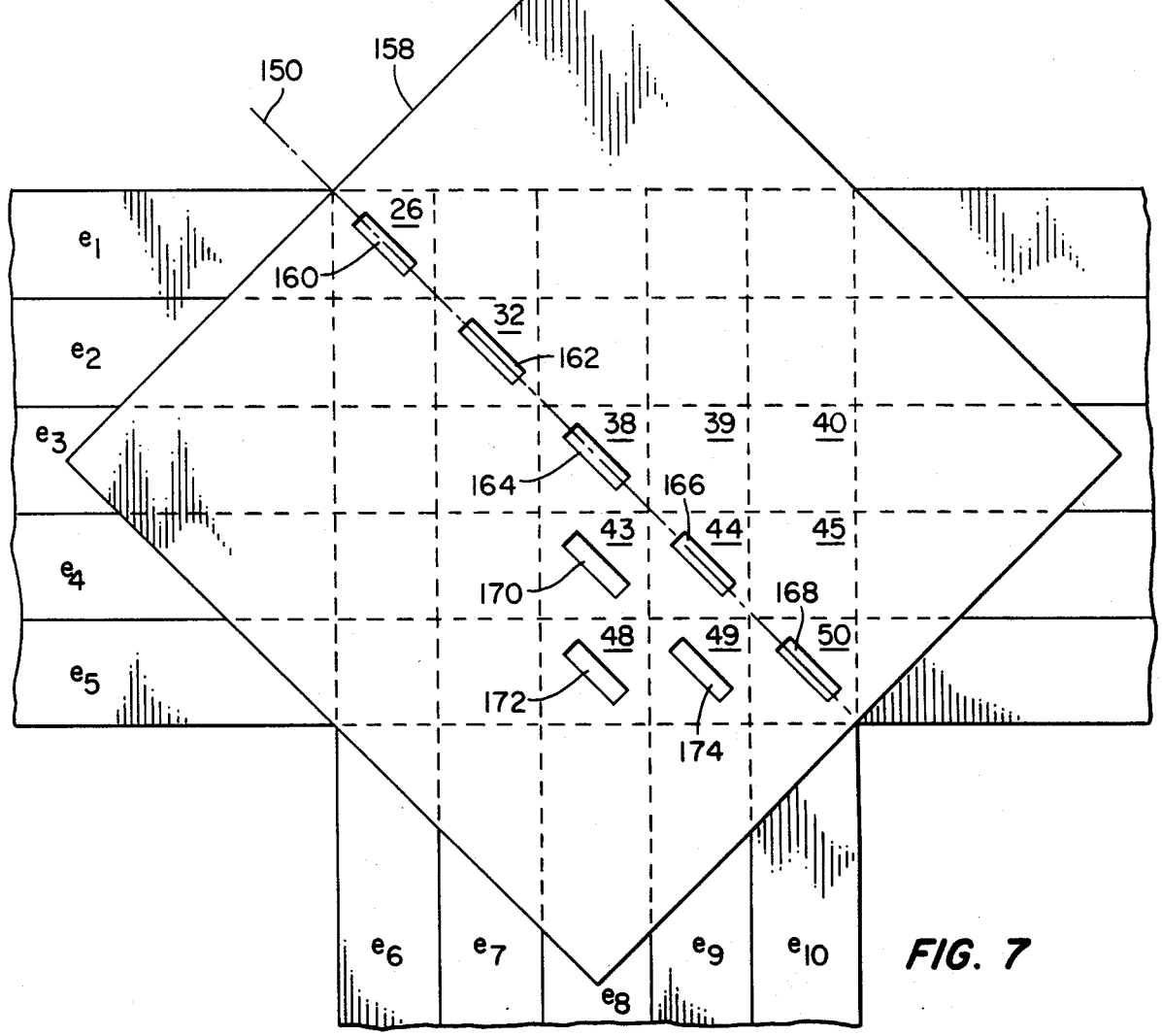
FIG. 7 is a schematic illustration of a connection guide overlying a pair of overlapped five-conductor cables.

Referring to FIG. 7, a stencil or plate member 158 is arranged in overlying relation to mutually orthogonal cables $e_1-e_5$ and $e_6-e_{10}$. Slot 160 is arranged along axis 150 in registry with zone 26. When an installer arranges the stencil and outlines a prospective cable aperture by use of slot 160, he precludes possible connection of conductors $e_1$ and $e_6$ to any other conductors. Slot 162, adjacent to slot 160 along axis 150 is in registry with zone 32. When an installer outlines a cable connection by use of slot 162, he compels interconnection of cables $e_2$ and $e_7$ and precludes connection of these two conductors to any other conductors. As for conductor $e_3$, stencil 158 permits but a single connection, i.e., to conductor $e_8$. This arrangement forces distribution of phase A through conductors $e_3$ and $e_8$. Since slots are not included in registry with zones 39 and 40, erroneous, redundant phase A connections are precluded. On the other hand, by inclusion of slots 170 and 172, in registry with zones 43 and 48, the stencil permits the routing of a B phase or C phase to conductor $e_8$.

In the case of conductor $e_4$, stencil 158 does not include a slot in registry with zone 45, having slot 170 in registration with zone 43 and slot 166 in registration with zone 44. The stencil thus biases distribution of B phase to either conductor $e_8$, as noted above, or conductor $e_9$, accordingly reducing the possibility of erroneous, redundant connection to conductor $e_4$ by such omission of zone 45.

By inclusion of slots 172, 174 and 168 in respective registration with zones 48, 49 and 50, the stencil 158 permits distribution of C phase from conductor $e_5$ to any of conductors $e_8$, $e_9$ and $e_{10}$. The pattern geometry selected in FIG. 7 is such that all of slots 160-168 are aligned along axis 150, which is the diagonal of the connection matrix common to the two multiconductor cables. Slots 170 and 174 are aligned along a first axis parallel to axis 150 and slot 172 is aligned along a second axis parallel to axis 150.

Figure 9:
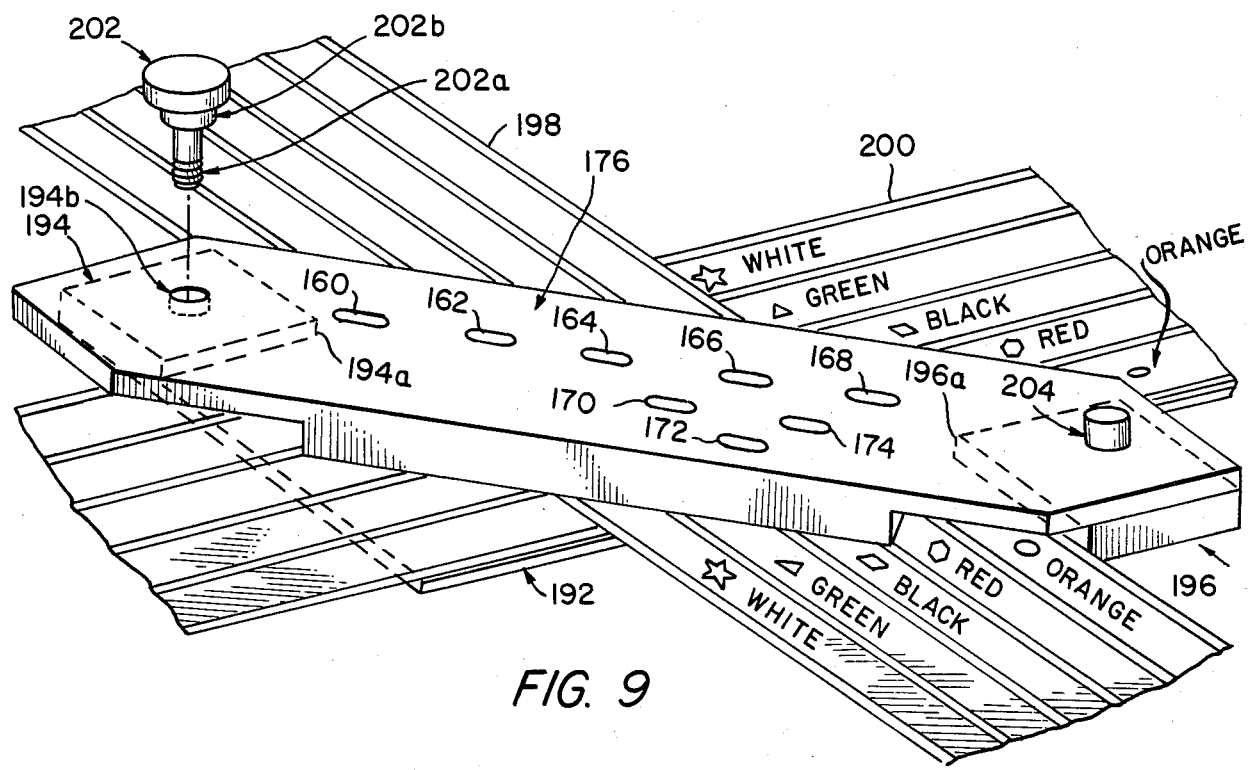
FIG. 9 is a perspective view showing the connection guide of FIG. 8 in operative disposition relative to a base therefor and a pair of overlapped five-conductor cables.
Figure 8:
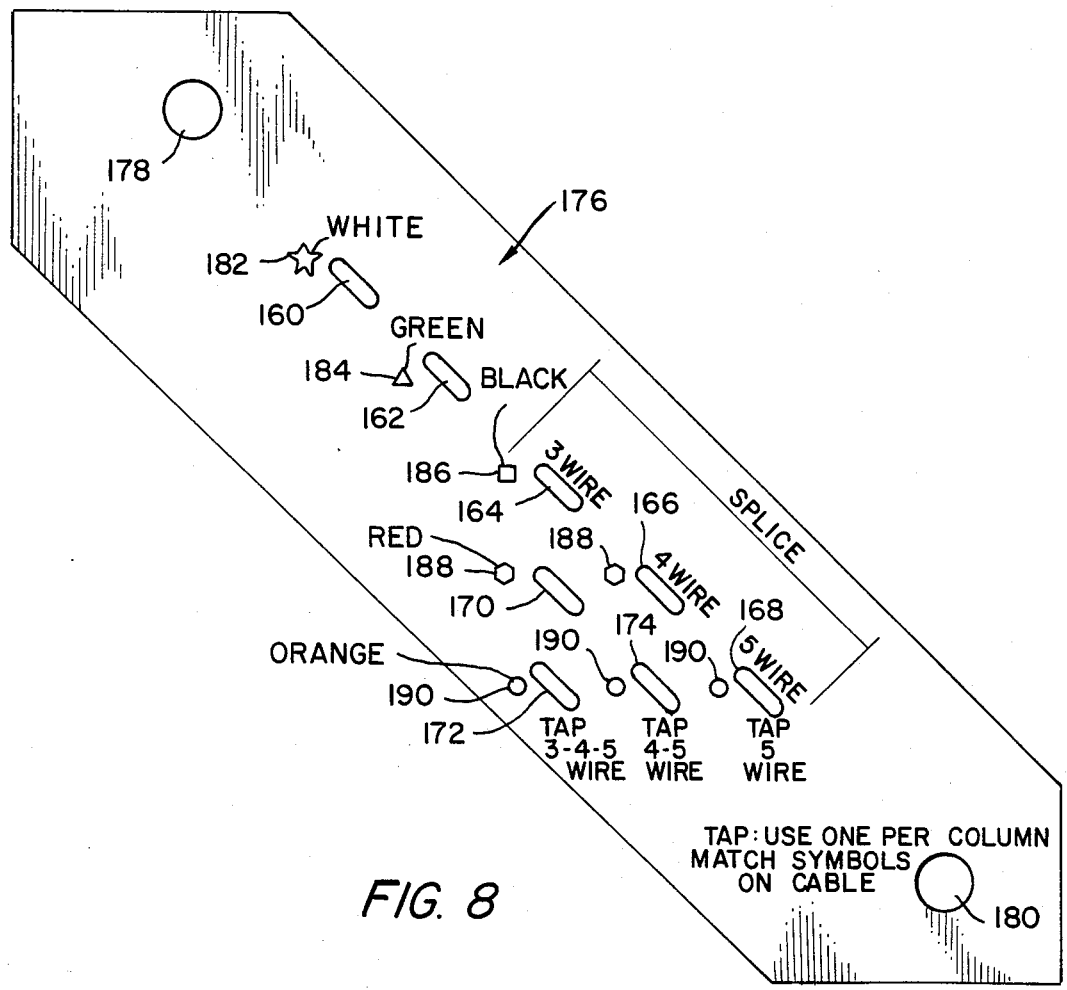
FIG. 8 is a plan view of a preferred embodiment of a connection guide of the invention.

The limited error connection possibility resident in stencil 158 of FIG. 7 is further diminished by reliance on identifying indicia on both cable and stencil, as is developed in the apparatus shwon in FIGS. 8 and 9. In FIG. 8, a plate member 176 incorporates slots 160-174 in identical pattern with that of stencil 158 in FIG. 7. Registration holes 178 and 180 are provided at ends of plate 176 and the plate includes discriminating indicia 182, in the form of a star, 184, in the form of a triangle, 186, in the form of a square, 188, in the form of a hexagon and 190, in the form of a circle. Conductors $e_1$ through $e_5$ and conductors $e_6$ through $e_{10}$ (FIG. 7) bear corresponding indicia. Additionally, plate 176 bears literal indications adjacent various slots. The term "SPLICE" encompasses slots 164, 166 and 168 and the slots respectively bear terms "3 WIRE", "4 WIRE" and "5 WIRE". Under the vertical column including slots 164, 170 and 172, the plate bears the legend "TAP 3-4-5 WIRE". The vertical column including slots 166 and 174 bears the legend "TAP 4-5 WIRE". Beneath slot 168 is the legend "TAP 5 WIRE". Adjacent hole 180 is the legend "TAP: USE ONE PER COLUMN MATCH SYMBOLS ON CABLE".

As noted above, cable markings are invariantly made through slots 160 and 162. In the case of a splice, i.e., connection of two longitudinally aligned and overlapping cables, slots 164-168 are used depending upon the number of wires in the conductors.

In the case of a tap, i.e., connection of two cables in overlapping and orthogonal relation, all slots may be used. Proper connections and maintenance of polarity is assured simple recognition of the indicia. Each indicium is uniquely colored to further facilitate proper connections. Table 2 indicates the various connection possibilities achievable.

TABLE 2

| Slots | Connection(s) Achieved |
|---|---|
| 160, 162 and 164 | three conductor cable to three conductor cable splice (phase A) three conductor cable to three, four or five conductor cable tap (phase A) |
| 160, 162, 164 and 166 | four conductor cable to four conductor cable splice (phases A and B) four conductor cable to four or five conductor cable tap (phases A and B) |
| 160, 162, 164, 166 and 168 | five conductor cable to five conductor cable splice (three phase) five conductor cable to five conductor cable tap (three phase) |
| 160, 162, 170 | three conductor cable to four or five conductor cable tap (phase B) |
| 160, 162 and 172 | three conductor cable to five conductor cable tap (phase C) |
| 160, 162, 170 and 174 | four conductor cable to five conductor cable tap (phases B and C) |
| 160, 162, 164 and 174 | four conductor cable to five conductor cable tap (phases A and C) |

In FIG. 9, plate 176 is shown with cooperative structure providing therewith an installation tool. For convenience, the literal legends and indicia are omitted, but would be included in the device. Base 192 is formed with upwardly extending cable guides 194 and 196, which receive cables 198 and 200 and place the cables in proper orientation with respect to the slot pattern in plate 176. Thus, the cables are made mutually orthogonal and slots 160-168 register with a line extending between edge corners 194a and 196a of guides 194 and 196. Guide 194 has a threaded bore 194b for receipt of pin 202 having threaded end 202a and shoulder 202b. Pin 204 may be fixedly secured to guide 196 to serve as a pivot for movement of plate 176 into operative position whereupon pin 202 is threaded into guide 194.

Figure 11:
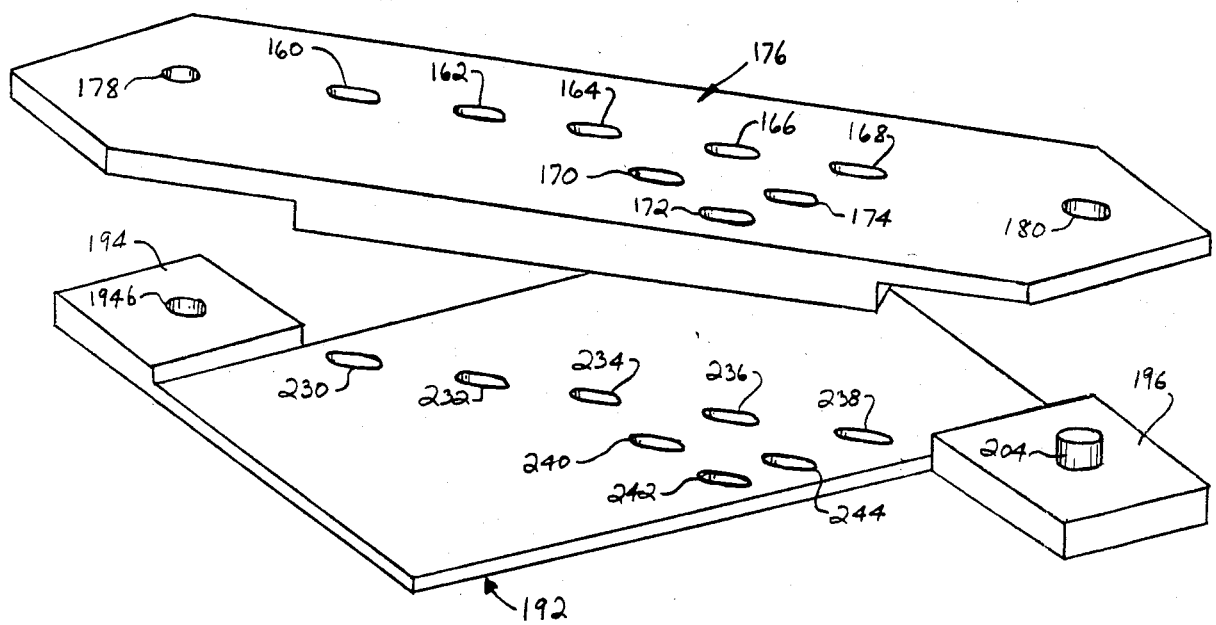
FIG. 11 is a perspective, exploded view showing plate and base components of the connection guide of FIG. 9

In the FIG. 9 arrangement, base 192 preferably functions as a die and has slots 230-244, as shown in FIG. 11, in its upper surface in pattern and configuration conforming with the slots 160-174 of plate 176. To perforate the cables a punch or punches would be inserted in the guide holes in plate 176 in the positions which provide the proper perforations for the connection to be made. Application of an appropriate force or forces to the punch or punches would then create the desired perforation pattern in the cables. Base 192 preferably includes a removable tray for collection of matter thus punched out of the cables. Connectors of type shown in FIG. 6 would then be inserted and crimped to complete the connection.

In preferred practice, the stencil indicia are colored as follows: 182 white; 184 green; 186 black; 188 red; and 190 orange. Cable insulation over conductors is correspondingly colored, e.g., for a five-conductor cable: neutral-white; ground-green; phase A-black; phase B-red; and phase C-orange.

Figure 10:
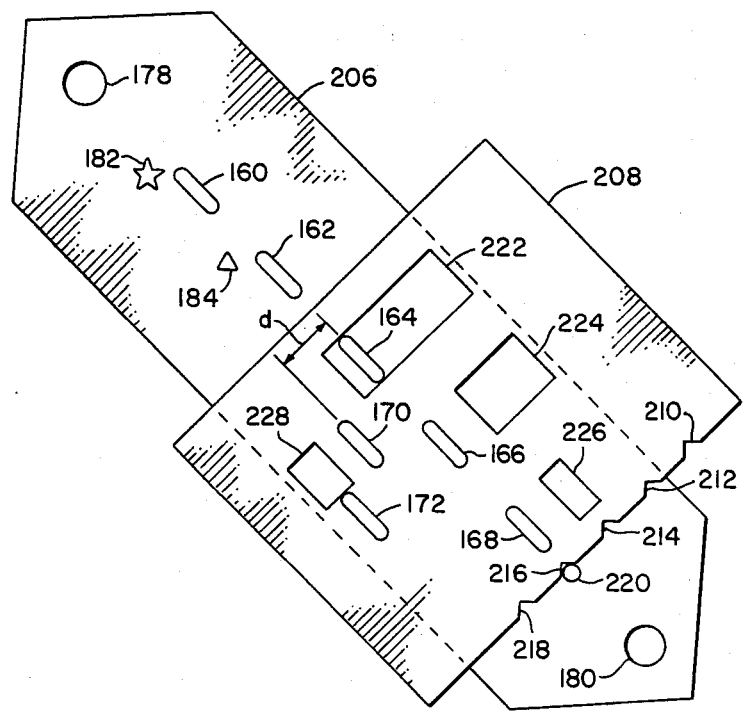
FIG. 10 is a plan view of a further preferred embodiment of a connection guide of the invention.

The arrangement of FIG. 10 includes connection guide 206 which has a slot pattern modified from that of FIG. 8 by omission of slot 174 thereof and by omission of all instructional indicia other than that adjacent slots 160 and 162. The omitted slot had sole use in a four-to-five tap and such capability remains through slots 170 and 172. Selector plate 208 overlies guide 206 and includes side notches 210–218, notch 216 being shown in registry with detent 220 of guide 206. Plate 208 has openings 222, 224, 226 and 228 therethrough for rendering accessible only selective of the connection guide openings. While shown as transparent, the plate is desirably opaque.

As in the case of FIG. 8, slots 160 and 162 are used in all connections of cables. In the position shown for plate 208, phase A only is available, use of slots other than slots 160, 163 and 164 being precluded since such other slots are not in registry with any of openings 222–228. On the other hand, if plate 208 is indexed to place notch 218 in engagement with detent 218 in engagement with detent 220, with the plate and guide still in orthogonal relation, slot 170 is now alone exposed through plate 208. Phase B thus is made available for a three-conductor tap. The indexing distance, i.e., the spacing between peaks of adjacent notches, is the distance d (FIG. 10) established by the slot pattern in guide 206. The extent and position of openings 222–228 is preselected to provide the desired variety of connections. The following table is further expositive of indexing of plate 208.

TABLE 3

| INDEXED NOTCH | SLOTS FOR USE |
|---|---|
| 210 | 160, 162 and 172 |
| 212 | 160, 162, 164 and 166 |
| 214 | 160, 162, 164, 166 and 168 |
| 216 | 160, 162 and 164 |
| 218 | 160, 162 and 170 |

The connections achieved with the indicated slots are noted above in Table 2.

As will be seen, practice wherein neutral and ground connections are in respective singular connection zones of the matrix of connection zones results in repetitive selection of neutral and ground connection zones, i.e., identical geometry in separate connections of a first pair and a second pair of cables, thus carrying polarization throughout an entire installed system. This practice may be restricted to connection of a single pair of conductors to a specific repetitive zone, e.g., an outermost conductor of each cable. While mutual orthogonality of cables is preferred, other alignment is within the purview of the invention. Also, zone selection pattern may be other than a diagonal of the matrix; as noted in Table I for a three-three matrix.

In the aspect of the foregoing disclosure wherein connection guiding is by stencil or the like, far less than all of the connection zones of the matrix are employable. Connection of at least one pair of conductors is effected by preclusion of use of zones other than a singular zone. In this case, the connection guide has an aperture in registry with such singular zone and continuous surface expanse extending in directions mutually perpendicular from such aperture. Connection of at least one other conductor pair of compelled to less than all zones with which such conductors are in registry. In this case, the connection guide has plural apertures in registry with a common conductor of a cable, i.e., along an axis parallel to the conductors of one cable and orthogonal to the conductors of the other cable where the guide arranges the cables in mutually orthogonal relation.

Various changes to the foregoing, specifically disclosed embodiments and practices will be evident to those skilled in the art. Accordingly, the foregoing preferred embodiments are intended in an illustrative and not in a limiting sense. The true spirit and scope of the invention is set forth in the following claims.

What is claimed is:

1. Apparatus for use in the connection of flat multiconductor cables disposed in mutually overlapping relation and defining a matrix of connection zones wherein each zone has a unique pair of cable conductors in registry therewith, said apparatus comprising: a connection guide defining openings therethrough in registry with less than all of said connection zones; and selector means variably positionable with respect to said connection guide for rendering accessible for use only selective of said connection guide openings.

2. The apparatus claimed in claim 1 wherein said connection guide includes first means for precluding use of connection zones other than a singular zone of said matrix for connection of at least one pair of said conductors, said selector means being disposed in overlying relation to connection zones exclusive of said singular zone.

3. The apparatus claimed in claim 2 wherein said connection guide includes second means for compelling connection of another pair of said conductors to preselected plural zones of said matrix, said selector means being disposed in overlying relation to said preselected plural zones.

4. The apparatus claimed in claim 3 wherein said connection guide includes third means for aligning said cables in a preselected orientation.

5. The apparatus claimed in claim 4 wherein said third means aligns said cables in mutually orthogonal orientation, said selector means being indexable with respect to said connection guide along an axis parallel to one of the orthogonal axes defining said mutually orthogonal orientation.

6. Apparatus for use in the connection of flat multiconductor cables disposed in mutually overlapping relation and defining a matrix of connection zones wherein each zone has a unique pair of cable conductors in registry therewith and extending electrically continuously therethrough, said apparatus comprising a connection guide including means (1) providing access to one such zone having a first conductor of each such cable in registry therewith and precluding connection access to all other zones in said matrix having either of such first conductors in registry therewith and (2) providing connection access to plural of such zones in registry with a second conductor of one of said cables and precluding connection access to all other zones in said matrix having said second conductor in registry therewith, said connection guide further comprising alignment means for receiving said cables and for conforming the relative orientation thereof to a preselected orientation, said alignment means including first and second spaced edge means for receipt of said cables and a plate member having a plurality of openings therethrough in spaced registry with said access means (1) and (2), certain ones of said openings being in registry with an axis extending between respective corners of said edge means, other ones of said openings being in registry with an axis parallel to said axis extending between respective corners of said edge means.

* * * * *